(12) United States Patent
Bombay et al.

(10) Patent No.: US 7,701,408 B2
(45) Date of Patent: Apr. 20, 2010

(54) SHIELDED CONTACTLESS ELECTRONIC DOCUMENT

(75) Inventors: Bart Bombay, Austin, TX (US); Neville Pattinson, Austin, TX (US); Ksheerabdhi Krishna, Austin, TX (US); Yves Reignoux, Montrouge (FR); Severine Cheramy, Montrouge (FR); Joseph Leibenguth, Montrouge (FR); Denis Groeninck, Montrouge (FR); Jean-Pierre Lafon, Montrouge (FR)

(73) Assignee: Axalto SA, Meudon Cedex (FR)

( * ) Notice: Subject to any disclaimer, the term of this patent is extended or adjusted under 35 U.S.C. 154(b) by 36 days.

(21) Appl. No.: 11/629,763

(22) PCT Filed: Apr. 1, 2005

(86) PCT No.: PCT/IB2005/000861
§ 371 (c)(1),
(2), (4) Date: Dec. 15, 2006

(87) PCT Pub. No.: WO2006/005984
PCT Pub. Date: Jan. 19, 2006

(65) Prior Publication Data
US 2007/0205953 A1 Sep. 6, 2007

Related U.S. Application Data

(60) Provisional application No. 60/622,819, filed on Oct. 28, 2004.

(30) Foreign Application Priority Data

Jun. 16, 2004 (EP) .................................. 04291520
Sep. 6, 2004 (EP) .................................. 04292139

(51) Int. Cl.
*H01Q 1/52* (2006.01)

(52) U.S. Cl. .............................. 343/841; 343/700 MS; 343/895

(58) Field of Classification Search ...................... None
See application file for complete search history.

(56) References Cited

U.S. PATENT DOCUMENTS 3,584,134 A * 6/1971 Nichols et al. .............. 174/383
6,147,302 A * 11/2000 Matsuo et al. .............. 174/390

(Continued)

FOREIGN PATENT DOCUMENTS

DE 3709852 A1 10/1988

(Continued)

OTHER PUBLICATIONS

International Search Report for PCT/IB2005/000861 mailed Jul. 12, 2005 (2 pages).

(Continued)

*Primary Examiner*—Trinh V Dinh
(74) *Attorney, Agent, or Firm*—Osha • Liang LLP

(57) ABSTRACT

A document which includes a cover, one or more internal pages, a radiofrequency microcontroller, an antenna electrically connected to the radiofrequency microcontroller, an electromagnetic shield capable of partially disrupting wireless communication with the radiofrequency microcontroller when the document is closed, and not disrupting the wireless communication when the document is opened is described. The electromagnetic shield included in the document is implemented using metal, conductive plastic, conductive ink or magnetic ink.

7 Claims, 3 Drawing Sheets

U.S. PATENT DOCUMENTS

| | | | |
|---|---|---|---|
| 6,262,364 | B1 | 7/2001 | Yoshikawa et al. |
| 6,608,550 | B2 * | 8/2003 | Hayashi et al. ......... 340/10.34 |
| 2002/0105752 | A1 * | 8/2002 | Soda et al. ................... 360/90 |
| 2002/0108704 | A1 | 8/2002 | Umezawa et al. |
| 2003/0057286 | A1 | 3/2003 | Yamagishi et al. |
| 2003/0168514 | A1 | 9/2003 | Rancien et al. |
| 2005/0274794 | A1 * | 12/2005 | Bason et al. ................ 235/380 |
| 2007/0090954 | A1 * | 4/2007 | Mahaffey ................ 340/572.3 |
| 2008/0169901 | A1 * | 7/2008 | Timm et al. ................ 340/5.81 |
| 2008/0186186 | A1 * | 8/2008 | Campbell ................ 340/572.8 |

FOREIGN PATENT DOCUMENTS

| | | |
|---|---|---|
| EP | 0 886 232 | 12/1998 |
| FR | 2 784 083 | 4/2000 |
| JP | 11-348471 | 12/1999 |
| JP | 223095 A * | 8/2002 |

OTHER PUBLICATIONS

Patent Abstracts of Japan 11-348471 published Dec. 21, 1999 (2 pages).

Mechanical English Translation of European Patent DE3709852, Published Oct. 6, 1988. (8 Pages).

\* cited by examiner

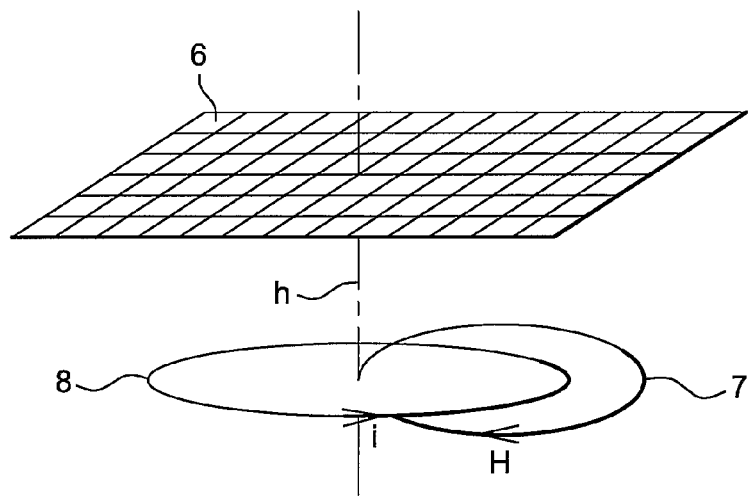
Fig. 3
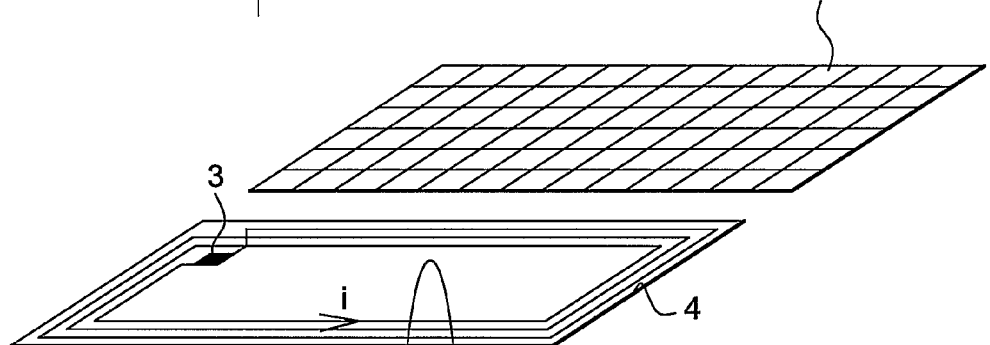
Fig. 4A
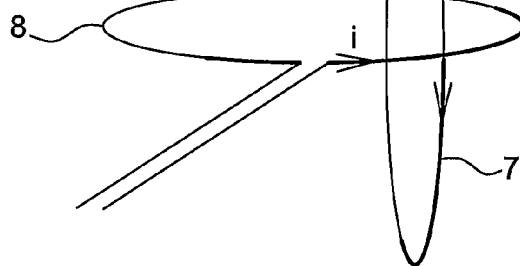
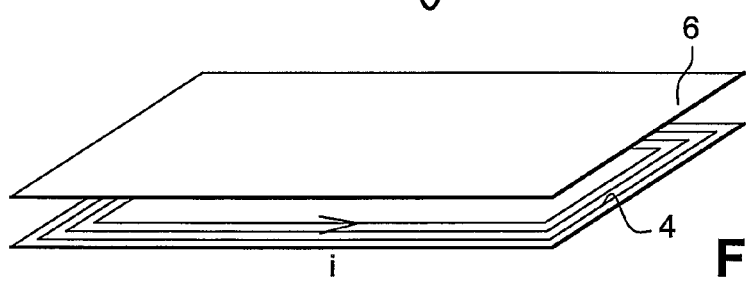
Fig. 4B

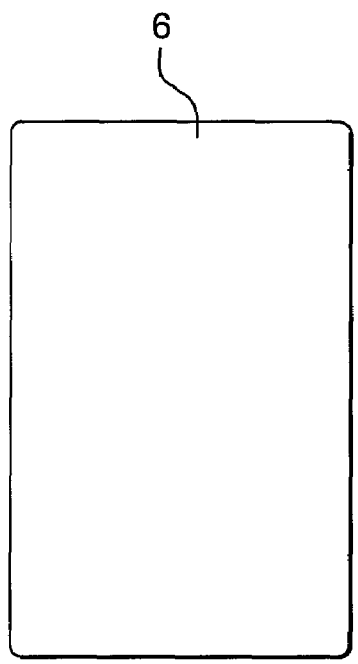
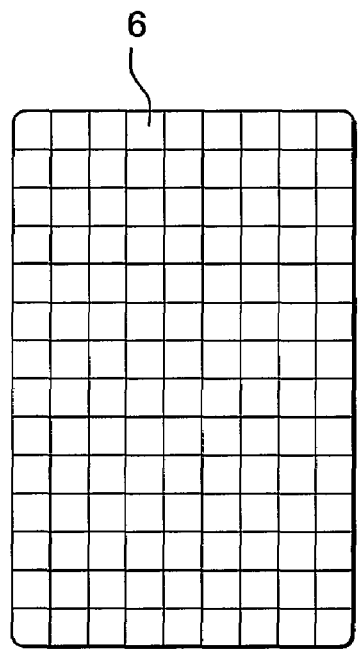
Fig. 5A  Fig. 5B
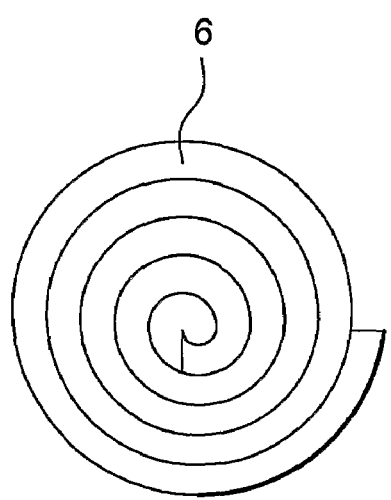
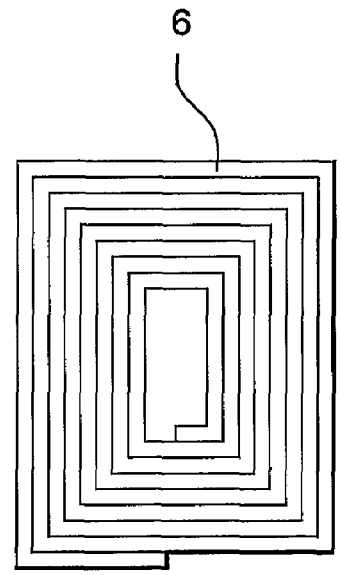
Fig. 5C  Fig. 5D

SHIELDED CONTACTLESS ELECTRONIC DOCUMENT

BACKGROUND

The invention relates to documents comprising a cover, at least one internal page, a radiofrequency microcontroller and an antenna electrically connected to contact pads of said microcontroller. It relates more specifically to identification documents such as passports.

Since the terrorist attacks of 2001, the United States Department of Homeland Security has wanted the world to agree on a standard for machine-readable passports. These passports would include an embedded microcontroller that would allow the passport to contain more information than a machine-readable character font. They would include a contactless communication interface that would allow passport officials to quickly and easily read that information.

Radiofrequency identification (RFID) technology appears to comply with the above requirements.

However, there are some concerns about using this technology for passports.

For instance, in an article dated 4 Oct. 2004 of the International Herald Tribune, it was written: "These [RFID] chips are like smart cards, but they can be read from a distance. A receiving device can "talk" to the chip remotely, without any need for physical contact, and get whatever information is on it. [ . . . ] It means that passport holders are continuously broadcasting their name, nationality, age, address and whatever else is on the RFID chip. It means that anyone with a reader can learn that information, without the passport holder's knowledge or consent. It means that pickpockets, kidnappers and terrorists can easily—and surreptitiously—pick Americans or nationals of other participating countries out of a crowd."

This article is obviously sensationalistic in nature. However, despite this sensationalism, the article depicts a real commercial issue and a solution has value.

An existing solution is an electromagnetic shielding bag commercialised under the brand name mobileCloak™, into which bag is placed a passport or other contactless product. A similar solution to the mobileCloak™ bag is disclosed in the article of Mr. Matt Hines, 24 Feb. 2004, CNET News.com. This article refers to the RSA Blocker Tag technology introduced by the company RSA Security™. The RSA Blocker Tag is an RFID cloaking system intended to guard proprietary data located on chips used to carry product information. It uses a jamming system designed to confuse RFID readers and prevent some devices from tracking data on individuals or goods outside certain boundaries. It works by emitting radio frequencies designed to trick RFID readers into believing that they are presented with unwanted data, or spam, causing the information collection devices to shun the incoming transmission. When an RFID-loaded product is placed into a bag bearing at least one blocker tag, the system would cause RFID readers to miss any information carried by the product, thereby protecting consumers. When the product is taken out of the bag, readers would again be able to scan the RFID chip of the RFID-loaded product accurately. According to RSA Security™, this cloaking system would not interfere with the normal operation of RFID systems or allow hackers to use security technology to bypass theft control systems or launch denial-of-service attacks.

In fact, placing an RFID device into an electromagnetic shielding bag as in the above solutions may effectively prevent surreptitious attacks against RFID products, but this requires an additional effort and inconvenience for the user of the product. This inconvenience indicates a suboptimal solution, especially in the mass market where users frequently forego such inconveniences.

Other solutions have been proposed. One of these is disclosed in an article dated 20 Sep. 2004, Computerworld™, of Mark Willoughby. In this article, Ms Sue Hutchinson, Director of EPCglobal™ U.S., said "Part of our standards development was a second-generation UHF air interface protocol, the protocol that manages data moving between the tags and readers. It includes some protection for data on the chip. When data is written to the tag, the data is masked going over the air interface. All of the data coming from the reader to the tag is masked, so parts of the write can't be intercepted as it's coming from the reader to the tag. Once data is written to the tag, it can be locked so that it can be read but not altered—it's read only".

However, even while an authentication mechanism may prevent reading of the RFID tag data, repeated failed reading attempts may cause attack resistance code on the tag to disable the tag, thus leaving the tag vulnerable to denial of service attacks.

Considering the above, a problem according to the invention is to impede the unauthorised or surreptitious reading of contactless documents, in particular, identification documents such as passports.

SUMMARY

The present invention describes a solution to this problem for electronically tagged document. According to this solution, the document comprises a cover, at least one internal page, a radiofrequency microcontroller and an antenna electrically connected to said microcontroller, and is characterised in it further comprises an electromagnetic shield capable of disrupting the wireless communication with said microcontroller when the document is closed.

Other features and aspects of the present invention will be apparent from the following description and the accompanying drawings, in which:

BRIEF DESCRIPTION OF DRAWINGS

FIG. 3 illustrates the induction vector at M, when an electromagnetic shield according to the invention is positioned close to the antenna of a document according to the invention;

FIGS. 4a and 4B illustrates the magnetic field that exists when the document according to the invention is open or closed, respectively; and FIGS. 5A, 5B, 5C and 5D show various embodiments of an electromagnetic shield according to the invention.

DETAILED DESCRIPTION

The document according to the invention is a document, in particular, an identification document which uses electromagnetic signals for wireless or contactless communication. According to a preferred embodiment, it is a passport.

Figure 1:
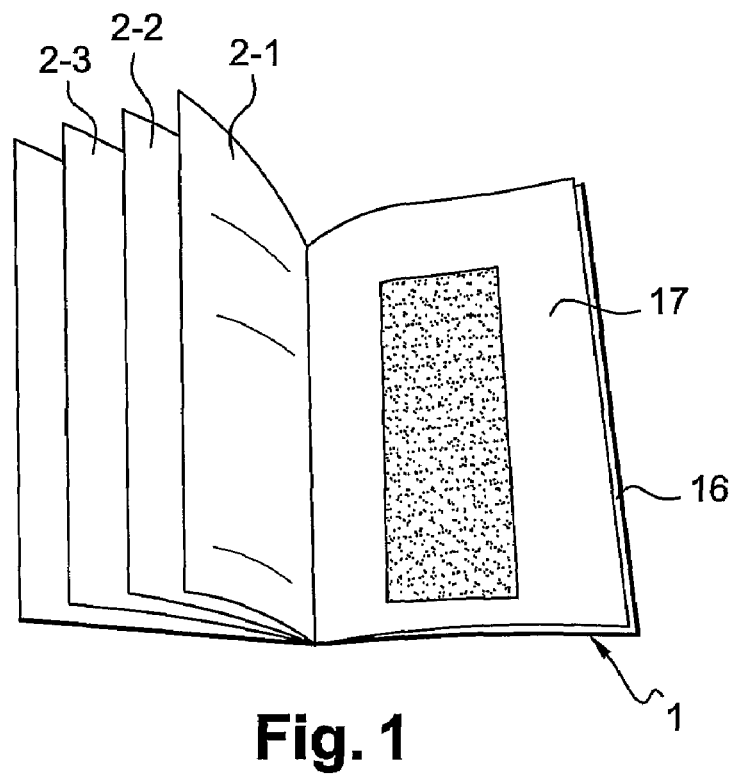
FIG. 1 illustrates a passport according to the invention.
Figure 2:
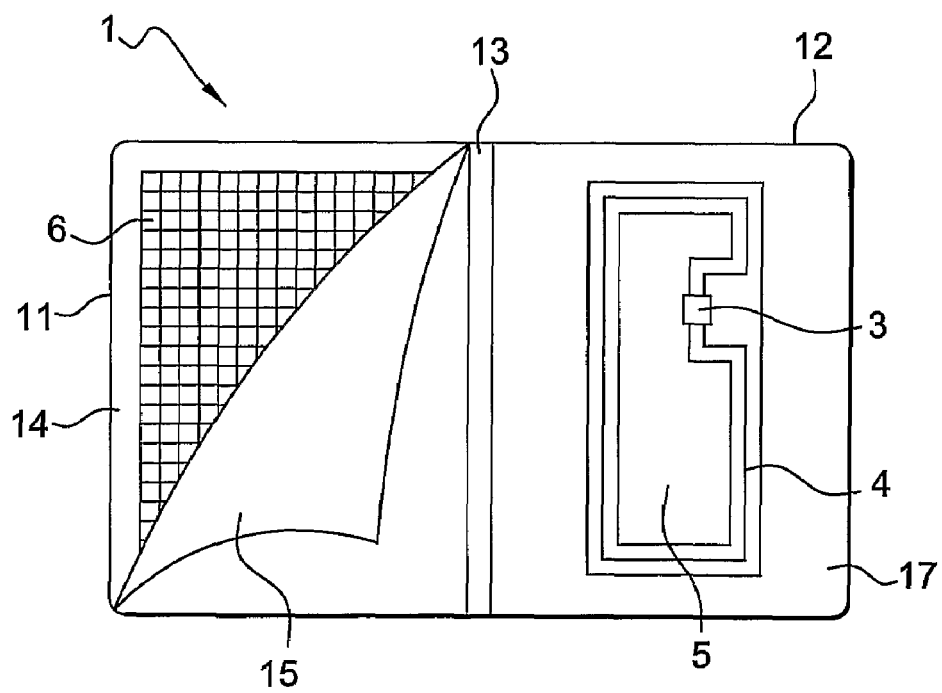
FIG. 2 illustrates the cover of a passport according to the invention.

A Passport according to the invention is shown in FIGS. 1 and 2. It comprises a cover 1, at least one internal page 2-1, 2-2 and 2-3, a radiofrequency microcontroller 3 and an antenna 4. As a result, it constitutes a booklet that may be opened or closed.

The cover 1 is flexible, made of paper, paperboard or plastic. It comprises two parts, a front cover part 11 and a back cover part 12, said parts being approximately equal in size and being linked by a passport hinge 13. In the example of FIGS. 1 and 2, the passport front cover part 11 comprises two layers 14 and 15. The first layer 14 is made of paperboard or plastic and the second layer 15 is made of paper or plastic. The first layer 14 is glued to the second layer 15. As of the front cover part 11, the back cover part 12 comprises two layers, a first layer 16 and a second layer 17. The first layer 16 is made of paperboard or plastic and the second layer 17 is made of paper, paperboard or plastic. The first layer 14 of the front cover part 11 and the first layer of the back cover part 12 form a unique continuous layer constituting the outside of the passport.

The internal pages 2-1, 2-2 and 2-3 are made of paper. They are glued to the passport hinge 13.

The microcontroller 3 is a radiofrequency (RF) component, which comprises at least two contact pads. It incorporates the RFID technology. Therefore, it is capable of contactless communication with a reader according to communication protocols that are disclosed in the ISO 14443 standards.

The contact pads of the microcontroller 3 are electrically connected to the terminal ends of the antenna 4 using bonding wires or bumps. Said antenna 4 includes of one or more turns. For example, it is made on a support layer 5 of Kapton™ using standard manufacturing techniques of the printed board industry. The antenna dimensions are usually a minimum of one quarter the wavelength size, in order to efficiently receive and transmit the contactless signals.

The microcontroller 3, the antenna 4 and the support layer 5 constitute an electronic module, said module being incorporated, in the example of FIGS. 1 and 2, in the second 17 layer of the back cover part 12.

According to the invention, the passport comprises an electromagnetic shield 6. In the example of FIGS. 1 and 2, this electromagnetic shield 6 constitutes a metallic grid. It is embedded between the already existing layers of the passport cover part. For example, it is inserted between the first 14 and the second 15 layers of the front cover part 11.

Incorporating the shield 6 according to the invention does not add significant weight or thickness to the passport cover 1. It may be done with or without externally optical visibility of said shield 6. Because, the shield 6 is embedded directly into the passport cover, the passport holder suffers no additional inconvenience, as would be the case with an enclosing bag of the prior art. In particular, as detailed later in the present description of the invention, the shield 6 is effective when located near only one side of the antenna 4, simplifying usage and manufacture. This is an advantage over shielding techniques of the prior art, that attempt to shield both sides of the antenna 4.

If the electronic module is incorporated in the one of the cover parts, the shield is preferably incorporated in the opposite cover part. However, it is noted that the shield 6 may also be positioned on both sides of the passport antenna 4, in particular if said antenna 4 is placed in or on an internal page 2-1, 2-2 or 2-3 of the passport, or if the shield 6 is positioned in or on an additional, secondary passport cover. Such a secondary passport cover could be attached, for example, stapled, subsequent to issuance by the passport issuer or by an intermediate agency. Similarly, the shield 6 could be applied to an internal passport page after manufacture of the passport or after issuance. The shield 6 could be, for example, glued to the passport page in a manner similar to what is often done with visas.

As shown in FIG. 3, the shield 6 is compared to a perfect electrically conducting plane located at a distance h of the reader antenna 8, and parallel to said reader antenna 8. When a current i is circulating into the reader antenna 8, an electromagnetic field of frequency W is generated. This electromagnetic field comprises two parts: the magnetic field part 7 and the electric field part.

When we consider the electromagnetic field in the vicinity of the perfectly conducting plane, it is expected to see an interface pattern of peaks and nulls, with the dimensions of that pattern related to the wavelength. Taking the approximation of the immediate neighbourhood close to the plane, for example within one eighth of a wavelength, then we may approximate the electromagnetic field strength with a linear function that goes to zero as we approach the perfectly conducting plane.

When the passport is opened as in FIG. 4A, the shield 6 is distanced from the antenna 4 and the electromagnetic field is not disrupted so that the microcontroller 3 data can be read.

However, when the passport is closed as in FIG. 4B, the shield 6 is located in the vicinity of the antenna 4, then, providing that the relative conductance of the shield 6 and the antenna 4 with load is sufficient, the shield 6 blocks and/or reflects the transmission of the radio-frequencies, and the electromagnetic field is reduced near the antenna 4. The coupling between the antenna 4 and the reader antenna 8 is dramatically reduced. This impedes attempts to read the microcontroller data.

Practically, the closer the shield is to the antenna 4, the more the coupling is reduced.

FIGS. 5A to 5D illustrate various embodiments of a shield 6 according to the invention.

In FIG. 5A, the shield 6 is a foil conductive layer. The surface of this layer is advantageously approximately equal to the surface of the antenna 4, or larger. The layer may be made of a metal or of a conductive plastic or a conductive ink that is applied inside or onto the passport cover or a passport page. The layer could be opaque, transparent or semi-transparent, and could also contain optical images. It could be applied, prior or subsequent to the passport manufacture, via electrolysis, sputtering, printing, precipitation, spraying, or other means.

In FIG. 5B, the shield 6 constitutes a wire grid. Again, the surface defined by this grid is advantageously approximately equal to the surface of the antenna 4, or more. The wires may be constructed of any conductive material, metallic or otherwise, including copper, aluminium, nickel, silver, gold, lead, mercury, iron or many other metals and materials, or any alloy of such metals and materials. Provided that the thickness of the passport is much less than the wavelength of the contactless communication signal or, more precisely, than the size of the antenna 4, that the wire mesh inter-wire distance or equivalent shield property is also much smaller than the RF wavelength and antenna size, and that the conductance of the shield is sufficiently high, then the shield will severely attenuate the incoming and outgoing RF signals on the antenna 4 and thus severely impede attempts to surreptitiously read the passport microcontroller data.

As current RFID wavelengths are of 2.4 GHz or 13.56 MHz, the wire mesh inter-wire distance is of much less than 12.5 cm or, respectively, 2212 cm. Preferably, the mesh grid has an inter-wire spacing ranging from 0.1 mm to 40 mm and, more preferably, an inter-wire spacing of approximately 1 mm.

Practically, the passport thickness is satisfactorily less than the RF wavelength so that the passport thickness to contactless communication wavelength ratio requirement is met with current passport and RFID technologies. Even with extra pages added to the passport and various visas pasted into the passport, the thickness of a passport is currently almost always less than 0.5 cm. In the case when a future RF technology uses wavelengths which are comparable to the passport thickness or, even in the current case, when the severe attenuation of the signal on the antenna is desired to be made even more severe, then the antenna may be applied to an internal page of the passport, and/or both cover parts may include an RF shield, effectively preventing any RF signal from reaching the antenna while the passport is physically closed.

Considering the case when the microcontroller antenna 4 is between the shielding cover part and the reader antenna 8, then the microcontroller antenna 4 is slightly in front of the shield and is therefore exposed to a part of the RF signal. In this case, the shield imposes that the RF signal is zero at the shield layer, and the strength of the RF signal will increase with distance from the shield layer. Because the distance between the RFID and the shield is much less than the wavelength of the RFID signal, the strength of the RF signal at the antenna is effectively proportional to that distance, with that strength becoming small as the closed passport thickness becomes much smaller than the RF wavelength. The response transmitted by the RFID is similarly attenuated by that same factor, and it is noted as well that the RFID ability to transmit is also impeded by the reduction of power in the received signal. Together, these impact on the RFID transceiver effectively impeding attempts to read the RFID data.

In FIGS. 5C and 5D, the shield 6 is in the form of a spiral. The spiral may be roughly ellipsoidal (FIG. 5C) or rectangular (FIG. 5D). It is advantageously a short-circuited and highly conductive approximate mirror image of the antenna such that, when the passport is closed, the mirror image antenna aligns with said antenna or, if not aligned, still provides sufficient attenuation of RF signals to be effective. The mirror image shield may be constructed from the same material as the antenna or from any other conductive material. The mirror image need not be an exact mirror image, but could be almost any conductive image of a comparable size to the antenna. In other examples, it could be a circle or a figure-eight.

Also, the shield may take many forms not represented in the drawings.

For example, the shield could take the form of a conductive wire cloth. Such a cloth is advantageously in a form that provides appropriate flexibility, elasticity and strength for the manufacture and usage of the enclosing product. Thus, the shield may provide not only electromagnetic shielding but also improve the structural durability and strength of the product. It may substitute or complement another material that is used in the passport for strength and/or durability.

The shield could also be implemented as a printing or other application of magnetic ink onto or into the passport cover or another of the passport pages. The magnetic ink shield could be a continuous film or printed mesh or any other configuration that is supported by the printing process and offers sufficient conductivity to realise the desired shielding effect. The magnetic ink shield could even be applied to a page of the passport using a stamp, much as visas are often applied. The magnetic ink that is printed could also be printed in such a manner that it contains information or data that may be visually- or machine-readable. The magnetic ink may be optically opaque or transparent or semi-transparent or even vary in optical properties depending upon the polarisation of the light that is striking the ink.

The shield may also be configured in a RF electromagnetic polarised manner such that it impedes reading for certain relative orientation of the reader and the passport.

What is claimed is:

1. A document comprising:
    a cover having a first cover part and a second cover part, wherein the first cover part comprises at least one selected from a group consisting of paper and paperboard;
    at least one internal page mounted between the two cover parts of the cover when the document is closed;
    a radiofrequency microcontroller;
    an antenna electrically connected to said microcontroller;
    an electromagnetic shield capable of disrupting, at least partially, the wireless communication with said microcontroller when the document is closed and not disrupting the wireless communication when the document is opened,
    wherein the electromagnetic shield is a wire grid implemented as a printing or other application of magnetic or conductive ink,
    wherein a wire mesh distance between each two adjacent wires of the wire grid is smaller than a radio-frequency wavelength used for communicating with the radiofrequency microcontroller, and
    wherein the wire mesh distance is at least 0.1 millimeters and at most 40 millimeters.

2. The document of claim 1, wherein the electromagnetic shield is incorporated into one of the cover parts.

3. The document of claim 2, wherein the antenna is incorporated to the other one of the cover parts.

4. The document of claim 1, wherein the electromagnetic shield is implemented on one of the internal pages.

5. The document of claim 1, wherein the conductance of the electromagnetic shield is greater than the conductance of the antenna.

6. The document of claim 1, wherein said document is an identification document.

7. The document of claim 6, wherein the identification document is a passport.

* * * * *